United States Patent
Jang et al.

(10) Patent No.: US 10,991,913 B2
(45) Date of Patent: Apr. 27, 2021

(54) ENCAPSULATING STRUCTURE CAPABLE OF SECURING BARRIER CHARACTERISTICS WITH REDUCED THICKNESS, DISPLAY DEVICE HAVING ENCAPSULATING STRUCTURE AND METHOD OF MANUFACTURING THE SAME

(71) Applicant: SAMSUNG DISPLAY CO., LTD., Yongin-si (KR)

(72) Inventors: Choelmin Jang, Yongin-si (KR); Sunghun Key, Yongin-si (KR); Junggon Kim, Yongin-si (KR); Myungsoo Huh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 99 days.

(21) Appl. No.: 16/199,848

(22) Filed: Nov. 26, 2018

(65) Prior Publication Data

US 2019/0237702 A1  Aug. 1, 2019

(30) Foreign Application Priority Data

Feb. 1, 2018  (KR) .......................... 10-2018-0013084

(51) Int. Cl.
*H01L 29/08* (2006.01)
*H01L 51/52* (2006.01)
(Continued)

(52) U.S. Cl.
CPC .......... *H01L 51/5256* (2013.01); *H01L 51/56* (2013.01); *H01L 27/3244* (2013.01);
(Continued)

(58) Field of Classification Search
CPC ................ H01L 51/5256; H01L 51/56; H01L 2251/5338; H01L 27/3244; H01L 2251/558; H01L 2251/303
See application file for complete search history.

(56) References Cited

U.S. PATENT DOCUMENTS 7,074,501 B2  7/2006  Czeremuszkin et al.
7,355,341 B2  4/2008  Yoshizawa
(Continued)

FOREIGN PATENT DOCUMENTS

KR  1020040027940  4/2004
KR  10-0653593  11/2006
(Continued)

*Primary Examiner* — Caleb E Henry
(74) *Attorney, Agent, or Firm* — F. Chau & Associates, LLC

(57) ABSTRACT

Provided are an encapsulating structure, an organic light-emitting display device including the encapsulating structure, and a method of manufacturing the same. The encapsulating structure includes a first barrier layer including a first inorganic layer having a first thickness; a plasma polymer layer on the first inorganic layer, the plasma polymer layer having a second thickness smaller than or equal to the first thickness; and a second barrier layer including at least one second inorganic layer on the plasma polymer layer. The at least one second inorganic layer has a third thickness, and the third thickness is smaller than or equal to the second thickness.

14 Claims, 5 Drawing Sheets

(51) Int. Cl.
 *H01L 51/56* (2006.01)
 *H01L 27/32* (2006.01)
(52) U.S. Cl.
 CPC ............... *H01L 2251/303* (2013.01); *H01L 2251/5338* (2013.01); *H01L 2251/558* (2013.01)

(56) References Cited

U.S. PATENT DOCUMENTS

| | | | |
|---|---|---|---|
| 7,518,142 B2 | 4/2009 | Hoffmann et al. | |
| 8,481,992 B2* | 7/2013 | Kho | H01L 27/3246 |
| | | | 257/40 |
| 9,196,849 B2 | 11/2015 | Jung et al. | |
| 9,728,739 B2* | 8/2017 | Mo | H01L 27/3244 |
| 10,396,310 B2* | 8/2019 | Choi | H01L 27/3246 |
| 2003/0203210 A1 | 10/2003 | Graff et al. | |
| 2014/0138634 A1 | 5/2014 | Lee et al. | |
| 2014/0190565 A1* | 7/2014 | Jung | H01L 51/0097 |
| | | | 136/259 |
| 2014/0322527 A1* | 10/2014 | Cho | H01L 51/5256 |
| | | | 428/339 |
| 2020/0039872 A1* | 2/2020 | Bellman | B32B 17/10128 |

FOREIGN PATENT DOCUMENTS

| | | |
|---|---|---|
| KR | 1020070118973 | 12/2007 |
| KR | 10-1389197 | 4/2014 |
| KR | 10-1465212 | 11/2014 |

* cited by examiner

ENCAPSULATING STRUCTURE CAPABLE OF SECURING BARRIER CHARACTERISTICS WITH REDUCED THICKNESS, DISPLAY DEVICE HAVING ENCAPSULATING STRUCTURE AND METHOD OF MANUFACTURING THE SAME

CROSS-REFERENCE TO RELATED APPLICATION

This application claims the benefit under 35 U.S.C § 119 of Korean Patent Application No. 10-2018-0013084, filed on Feb. 1, 2018, in the Korean Intellectual Property Office, the disclosure of which is incorporated by reference herein in its entirety.

TECHNICAL FIELD

Exemplary embodiments of the present inventive concept relate to an organic light-emitting display device and a method of manufacturing the same.

DISCUSSION OF RELATED ART

Liquid crystal display devices and organic light-emitting display devices including thin-film transistors (TFTs) are expanding their market into the area of displays for mobile devices. Such displays for mobile devices are required to be thin, lightweight, and unbreakable. To manufacture a thin and lightweight display, in addition to a technique for using a thin glass substrate, a process for using a conventional glass substrate and reducing the thickness of the conventional glass substrate afterwards by using a mechanical or chemical method has been introduced. However, such a process is complicated, and a display manufactured through the process may become fragile. Therefore, it is difficult to actually apply the process.

SUMMARY

Exemplary embodiments of the present inventive concept include an encapsulation structure capable of securing barrier characteristics with a reduced thickness and a display device including the encapsulation structure.

According to an exemplary embodiment of the present inventive concept, an encapsulating structure includes; a first barrier layer including a first inorganic layer having a first thickness; a plasma polymer layer on the first inorganic layer, the plasma polymer layer having a second thickness smaller than or equal to the first thickness; and a second barrier layer including at least one second inorganic layer on the plasma polymer layer, in which the at least one second inorganic layer has a third thickness and the third thickness is smaller than or equal to the second thickness.

The plasma polymer layer may include a carbon-containing silicon oxide.

The second barrier layer may be a multi-layer in which the at least one second inorganic layer and at least one organic layer are alternately deposited.

According to an exemplary embodiment of the present inventive concept, an organic light-emitting display device includes: a display unit disposed on a substrate; and an encapsulating member disposed on the substrate and the display unit and including: a first inorganic layer covering the display unit and the substrate and having a first thickness; a plasma polymer layer covering the first inorganic layer and having a second thickness smaller than or equal to the first thickness; and a barrier layer including at least one second inorganic layer covering the plasma polymer layer, in which the at least one second inorganic layer has a third thickness and the third thickness is smaller than or equal to the second thickness.

The plasma polymer layer may include a carbon-containing silicon oxide.

The barrier layer may be a multi-layer in which the at least one second inorganic layer and at least one organic layer are alternately deposited.

The plasma polymer layer may include material formed from a monomer selected from one of hexamethyldisiloxane, furan, hexane, and combinations thereof.

The plasma polymer layer may have a second angle greater than a first angle between a non-flat area of the substrate or the display unit and a flat top surface of the substrate or the display unit in the non-flat area.

The second angle may be an angle smaller than 180 degrees.

The second thickness may be smaller than or equal to half of height of the non-flat area.

According to an exemplary embodiment of the present inventive concept, a method of manufacturing an organic light-emitting display device, the method includes: forming a display unit on a substrate; forming a first inorganic layer having a first thickness on the display unit and the substrate; forming a plasma polymer layer on the first inorganic layer, the plasma polymer layer having a second thickness smaller than or equal to the first thickness; and forming a barrier layer on the plasma polymer layer, the barrier layer including at least one second inorganic layer having a third thickness smaller than or equal to the second thickness.

The plasma polymer layer may include a carbon-containing silicon oxide.

The at least one second inorganic layer may be formed through a chemical vapor deposition (CVD) process or an atomic layer deposition (ALD) process.

The barrier layer may be a multi-layer in which the at least one second inorganic layer and at least one organic layer are alternately deposited.

The at least one second inorganic layer may be formed through an atomic layer deposition (ALD) process, and the at least one organic layer may be formed through a chemical vapor deposition (CVD) process.

The plasma polymer layer may be formed from a monomer selected from one of hexamethyldisiloxane, furan, hexane, and combinations thereof.

The method may further include curing the plasma polymer layer through a plasma treatment.

The plasma polymer layer may have a second angle greater than a first angle between a non-flat area of the substrate or the display unit and a flat top surface of the substrate or the display unit in the non-flat area.

The second angle may be an angle smaller than 180 degrees.

The second thickness may be smaller than or equal to half of a height of the non-flat area.

According to an exemplary embodiment of the present inventive concept, an encapsulating structure includes: a display unit disposed on a substrate; and an encapsulating member disposed on the substrate and the display unit and including: a first inorganic layer covering the display unit and the substrate and having a first thickness; a plasma polymer layer covering the first inorganic layer and having a second thickness smaller than the first thickness; and a barrier layer including at least one second inorganic layer covering the plasma polymer layer, in which the plasma polymer layer has a second angle greater than a first angle between a non-flat area of the substrate or the display unit and a flat top surface of the substrate or the display unit in the non-flat area.

The second thickness may be smaller than or equal to half of a height of the non-flat area.

The second angle may be greater than 90 degrees and smaller than 180 degrees.

The barrier layer may be a multi-layer in which the at least one second inorganic layer and at least one organic layer are alternately deposited.

BRIEF DESCRIPTION OF THE DRAWINGS

These and/or other aspects will become apparent and more readily appreciated from the following description of the exemplary embodiments, taken in conjunction with the accompanying drawings in which.

Figure 1:
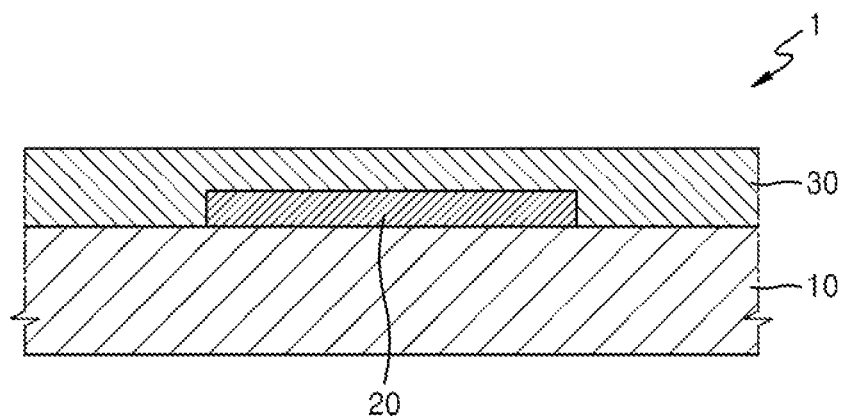
FIG. 1 is a schematic cross-sectional view of a display device according to an exemplary embodiment of the present inventive concept.

Since the drawings in FIGS. 1-10 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

As embodiments allow for various changes and numerous embodiments, particular exemplary embodiments of the present inventive concept will be illustrated in the drawings and described in detail in the written description. The effects and features of embodiments and methods of achieving them will be apparent with reference to the exemplary embodiments described in detail below with reference to the drawings. Embodiments may, however, be embodied in many different forms and should not be construed as limited to the specific exemplary embodiments set forth herein.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

Hereinafter, exemplary embodiments of the present inventive concept will be described in detail with reference to the accompanying drawings, wherein like reference numerals refer to like or corresponding elements throughout the drawings, and a duplicate description thereof will be omitted.

FIG. 1 is a schematic cross-sectional view of a display device according to an exemplary embodiment of the present inventive concept.

Referring to FIG. 1, a display device 1 according to an exemplary embodiment of the present inventive concept may include a substrate 10, a display unit 20 on the substrate 10, and an encapsulating member 30 covering the display unit 20. The display device 1 according to an exemplary embodiment of the present inventive concept may be an organic light-emitting display device.

The substrate 10 may be a flexible substrate. The substrate 10 may include a plastic material, that exhibits excellent heat resistance and durability and may provide a curved surface, such as, e.g., polyethylene ether phthalate, polyethylene naphthalate, polycarbonate, polyacrylate, polyetherimide, polyether sulfone, and polyimide. However, the present inventive concept is not limited thereto, and various flexible materials may be used. In addition, the substrate 10 may also be highly transparent.

The display unit 20 may include a plurality of pixels. The plurality of pixels may be arranged in a matrix in the row direction and the column direction. Each pixel may include a light-emitting device and a pixel circuit connected to the light-emitting device. The pixel circuit may include at least one thin-film transistor (TFT) and at least one capacitor and may drive the light-emitting device.

The encapsulating member 30 may include one or more thin films deposited on the display unit 20. In an exemplary embodiment of the present inventive concept, the encapsulating member 30 may include a plurality of thin films, thereby preventing outside moisture and/or air from penetrating into the display unit 20. For example, the encapsulating member 30 may substantially seal the display unit 20 from the surrounding environment so as to provide effective protection of the display unit 20 against oxygen and moisture.

Figure 2:
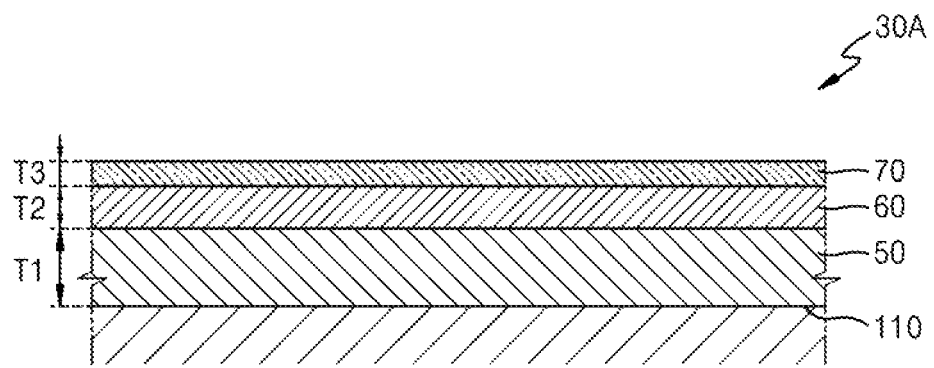
FIG. 2 is a cross-sectional view of an exemplary embodiment of the encapsulating member shown in FIG. 1.

FIG. 2 is a cross-sectional view of an exemplary embodiment of the encapsulating member 30 shown in FIG. 1.

Referring to FIG. 2, an encapsulating member 30A according to an exemplary embodiment of the present inventive concept may include a first barrier layer 50, a plasma polymer layer 60, and a second barrier layer 70, which are sequentially arranged on an insulating surface 110. For example, the first barrier layer 50, the plasma polymer layer 60 and the second barrier layer 70 may sequentially and vertically stacked on the insulating surface 110. The insulating surface 110 may be the top surface of the substrate 10, which is an insulating substrate, shown in FIG. 1, or the top surface of the display unit 20 above the substrate 10. The top surface of the display unit 20 may be the top surface of an insulating layer covering pixels.

The first barrier layer 50 has a first thickness T1 and may include an inorganic film. The first barrier layer 50 may be formed on the insulating surface 110 through, for example, a chemical vapor deposition (CVD) process or an atomic layer deposition (ALD) process.

The first barrier layer 50 may be a single layer or a multi-layer including any one of, for example, a silicon nitride ($SiN_x$) film, a silicon oxide ($SiO_2$) film, a silicon oxynitride (SiON) film, a metal film, or a metal oxide film, e.g., aluminum oxide ($Al_2O_3$), aluminum oxynitride (AlON), magnesium oxide (MgO), zinc oxide (ZnO), hafnium oxide ($HfO_2$), zirconium oxide ($ZrO_2$), etc., or a combination of two or more thereof. The first thickness T1 of the first, barrier layer 50 may be determined by taking the light efficiency of the display unit 20 into account.

In an exemplary embodiment of the present inventive concept, the plasma polymer layer 60 has a second thickness T2 and may include an organic film. The plasma polymer layer 60 may be formed on the first barrier layer 50 through a chemical vapor deposition (CVD) process, and more particularly, a plasma enhanced chemical vapor deposition (PECVD) process.

In an exemplary embodiment of the present inventive concept, the plasma polymer layer 60 may include a carbon, silicon, and oxide (for example, $SiO_xC_y$). The plasma polymer layer 60 may be formed through plasma polymerization of a monomer using $H_2$ gas or an oxygen-based gas, e.g., nitrous oxide ($N_2O$), oxygen ($O_2$), ozone ($O_3$), etc. The monomer for forming the plasma polymer layer 60 may include, for example, n-hexane, hexamethyldisiloxane (HMDSO), furan, tetramethyldisiloxane (TMDSO), $TMMOS(CH_3)_3SiOCH_3$, bis(trimethylsilyl)methane (BTMSM), tetraethoxysilane (TEOS), $DVTMDSO[(CH_3)_2ViSi—O—SiVi(CH_3)_2]$, octamethylcyclotetrasiloxane (OMCATS), or combinations thereof.

The second thickness T2 of the plasma polymer layer 60 may be determined as a thickness sufficient to form an obtuse angle in close proximity to an acute angle between a non-flat area of the substrate 10 or the display unit 20 and a top flat surface of the substrate 10 or the display unit 20. The acute angle formed by the non-flat area of the insulating surface 110 may be changed to an obtuse angle by filling of a fluid plasma polymer on the first barrier layer 50. The fluidity of the plasma polymer layer 60 may affect the determination of the second thickness T2 of the plasma polymer layer 60. For the plasma polymer layer 60 having high fluidity, smaller second thickness T2 may be sufficient. For example, the second thickness T2 of the plasma polymer layer 60 may be smaller than, or equal to a half of the height of the non-flat area. That is, there is no need to have the plasma polymer layer 60 thick enough to cover the entire non-flat area with its flat top surface above the top of the non-flat area. The height of the non-flat area may be equivalent to a distance from the top flat surface of the substrate 10 or the display unit 20 to the apex of the non-flat area of the substrate 10 or the display unit 20. The second thickness T2 of the plasma polymer layer 60 may be smaller than or equal to the first thickness T1 of the first barrier layer 50. As will be discussed below, the non-flat area may appear on the substrate 10 or the display unit 20 due to a stamp of a mask or particles generated during deposition of an electrode. Thus, the height of the non-flat area may depend on the process used in manufacturing the organic light-emitting display device.

The second barrier layer 70 may include at least one inorganic film. The at least one inorganic film may have a third thickness T3, and the third thickness T3 of the second barrier layer 70 may be smaller than or equal to the second thickness T2 of the plasma polymer layer 60. The second barrier layer 70 may be formed on the plasma polymer layer 60 through a CVD process or an ALD process. It is easier to control the thickness of an inorganic film by disposing the second barrier layer 70 through the ALD process than by disposing the second barrier layer 70 through the CVD process. ALD process may be used to form the inorganic film of the second barrier layer 70 to precisely control the deposited film thickness at nanometer scale.

The second barrier layer 70 may be a single layer or a multi-layer including any one of, for example, a silicon nitride ($SiN_x$) film, a silicon oxide ($SiO_2$) film, a silicon oxynitride (SiON) film, a metal film, or a metal oxide film, e.g., aluminum oxide ($Al_2O_3$), aluminum oxynitride (AlON), magnesium oxide (MgO), zinc oxide (ZnO), hafnium oxide ($HfO_2$), zirconium oxide ($ZrO_2$), etc., or a combination of two or more thereof.

The encapsulating member 30A according to the exemplary embodiment of FIG. 2 may include a plurality of thin films formed in a vacuum through a CVD process or an ALD process. Therefore, process complexity and fabricating cost may be reduced as compared to a process for fabricating an encapsulating member in the related art, in which a plurality of thin films are formed through separate processes (e.g., thin film deposition in a vacuum state and thin film deposition at room temperature). For example, the related art may dispose an organic thin film at room temperature through a spin-coating process or other room temperature processes.

FIGS. 3 to 7 are cross-sectional views schematically showing a process of manufacturing a display device, according to the exemplary embodiment shown in FIGS. 1 and 2.

Figure 3:
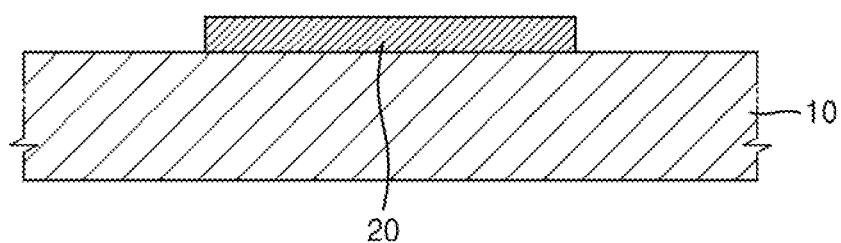
FIGS. 3 to 7 are cross-sectional views schematically showing a process of manufacturing a display device, according to the exemplary embodiment of the present inventive concept shown in FIGS. 1 and 2.
Figure 4:
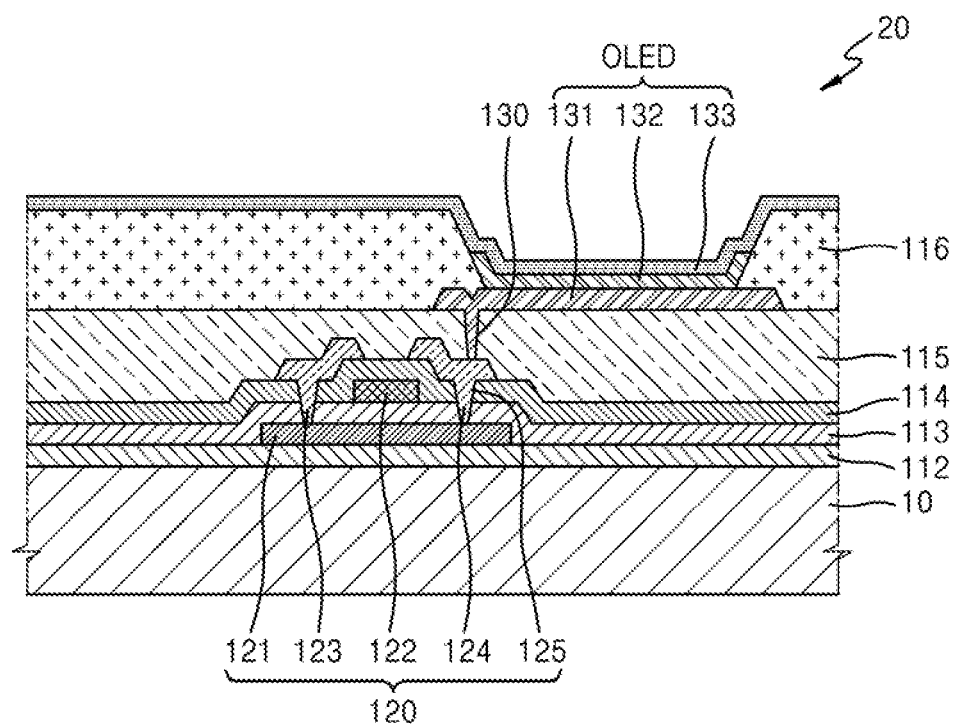

Referring to FIG. 3, the display unit 20 may be formed on the substrate 10. FIG. 4 is a cross-sectional view of the display unit 20 according to an exemplary embodiment of the present inventive concept. The display unit 20 includes a plurality of pixels, and each pixel may include a light-emitting device, such as organic light-emitting diode (OLED), and a pixel circuit including a TFT 120. The TFT 120 may include an active layer 121, a gate electrode 122, a source electrode 123, and a drain electrode 124.

Referring to FIG. 4, a buffer layer 112 is disposed on the substrate 10, a semiconductor layer is formed on the buffer layer 112, and then the semiconductor layer is patterned, thereby forming the active layer 121 of the TFT 120.

The buffer layer 112 may include at least one of an inorganic film and an organic film. For example, the buffer layer 112 may block penetration of impurity elements through the substrate 10 to the TFT 120 area, planarize a surface, and include a single layer or a multi-layer including an inorganic material like silicon nitride ($SiN_x$) and/or silicon oxide ($SiO_x$). The buffer layer 112 may be omitted.

The semiconductor layer may include various materials. For example, the semiconductor layer may include an inorganic semiconductor material like amorphous silicon or crystalline silicon. In another example, the semiconductor layer may include an oxide semiconductor or an organic semiconductor material.

A gate electrode 122 may be formed by forming a first insulating layer 113 on the active layer 121, forming a first conductive layer on the first insulating layer 113, and patterning the first conductive layer. The patterned first conductive layer may serve as the gate electrode 122.

The first insulating layer 113 may be an inorganic insulating film. The first insulating layer 113 may include a single layer or a multi-layer including one or more selected from among, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), and lead zirconate titanate (PZT).

The first conductive layer may include various conductive materials. For example, the first conductive layer may include a single layer or a multi-layer including one or more from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A contact hole 125 exposing portions of a source region and a drain region of the active layer 121 may be formed by disposing a second insulating layer 114 on the gate electrode 122 and patterning the second insulating layer 114.

The second insulating layer 114 may be an inorganic insulating film, and may include a single layer or a multi-layer including one or more selected from among, for example, $SiO_2$, $SiN_x$, SiON, $Al_2O_3$, $TiO_2$, $Ta_2O_5$, $HfO_2$, $ZrO_2$, BST, and PZT. However, the present inventive concept is not limited thereto. For example, in an exemplary embodiment of the present inventive concept, the second insulating layer 114 may be an organic insulating film.

A source electrode 123 and a drain electrode 124, which are respectively in contact with the source region and the drain region of the active layer 121, may be formed by forming a second conductive layer on the second insulating layer 114 and patterning the second conductive layer. The second conductive layer may fill the contact hole 125, and the patterned second conductive layer may serve as the source electrode 123 and the drain electrode 124.

The second conductive layer may include a single layer or a multi-layer including a material the same as that of the first conductive layer.

A via hole 130 exposing a portion of one of the source electrode 123 and the drain electrode 124 may be formed by disposing a third insulating layer 115 on the source electrode 123 and the drain electrode 124 and patterning the third insulating layer 115.

The third insulating layer 115 may include one organic insulating layer or a plurality of organic insulating layers. The third insulating layer 115 may include, for example, a common general-purpose polymer, e.g., poly(methyl methacrylate) (PMMA) or polystyrene (PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, and blends thereof. For example, the third insulating layer 115 may include polyimide, polyamide, an acrylic resin, etc.

The light-emitting device OLED electrically connected to the TFT 120 may be formed on the third insulating layer 115.

A first electrode 131 is disposed by forming a third conductive layer on the third insulating layer 115 and patterning the third conductive layer, and the first electrode 131 may be electrically connected to one of the source electrode 123 and the drain electrode (the drain electrode 124 in FIG. 4) through the via hole 130. The third conductive layer may fill the via hole 130, and the patterned third conductive layer may serve as the first electrode 131.

The third conductive layer may include a reflective layer including Ag, Mg, Al, Pt, Pd, Au, Ni, Nd, Ir, Cr, or a compound thereof, and a transparent or semi-transparent electrode layer including indium tin oxide (ITO), indium zinc oxide (IZO), zinc oxide (ZnO), or indium oxide ($In_2O_3$) below and/or above the reflective layer. In an exemplary embodiment of the present inventive concept, the third conductive layer may be a triple layer including ITO/Ag/ITO.

A fourth insulating layer 116 may be formed on the first electrode 131 to expose at least a portion of the first electrode 131 and cover edges of the first electrode 131.

The fourth insulating layer 116 may include one or a plurality of inorganic insulating films, or one or a plurality of organic insulating films described above.

An intermediate layer 132 may be formed on the exposed portion of the first electrode 131, and a second electrode 133 may be formed on the intermediate layer 132 to face the first electrode 131.

The intermediate layer 132 includes at least an emissive layer (EML) and may further include any one or more of functional layers including a hole injection layer (HIL), a hole transport layer (HTL), an electron transport layer (ETL), and an electron injection layer (EIL).

The EML may be a red EML, a green EML, or a blue EML. Alternatively, the EML may have a multi-layered structure in which a red EML, a green EML, and a blue EML are stacked to emit white light or may have a single layer structure including a red light-emitting material, a green light-emitting material, and a blue light-emitting material together to emit white light.

Although FIG. 4 shows that the intermediate layer 132 is patterned to correspond only to the first electrode 131, it is merely an example for convenience of explanation, and the intermediate layer 132 may also be formed integrally with the intermediate layer 132 of an adjacent pixel. Furthermore, various other modifications may be made therein. For example, some of the intermediate layer 132 may be formed in correspondence to respective pixels, and some other of the intermediate layer 132 may be formed integrally with the intermediate layers 132 of adjacent pixels.

The second electrode 133 may include a layer including, for example, lithium (Li), calcium (Ca), lithium fluoride/calcium (LiF/Ca), lithium fluoride/aluminum (LiF/Al), aluminum (Al), magnesium (Mg), or a compound thereof, and an auxiliary electrode or a bus electrode line that is formed on the layer by using a material for forming a transparent electrode, e.g., ITO, IZO, ZnO, $In_2O_3$, etc. In an exemplary embodiment of the present inventive concept, the second electrode 133 may be a layer including Ag:Mg.

Although the light-emitting device OLED is disposed to not to overlap the TFT 120 in the exemplary embodiment of FIG. 4, but the present inventive concept is not limited thereto. For example, the light-emitting device OLED may be disposed to at least partially overlap the TFT 120.

An inorganic layer may be further disposed on the second electrode 133. The inorganic layer may be disposed on the second electrode 133 through a CVD process or an ALD process.

Figure 5:
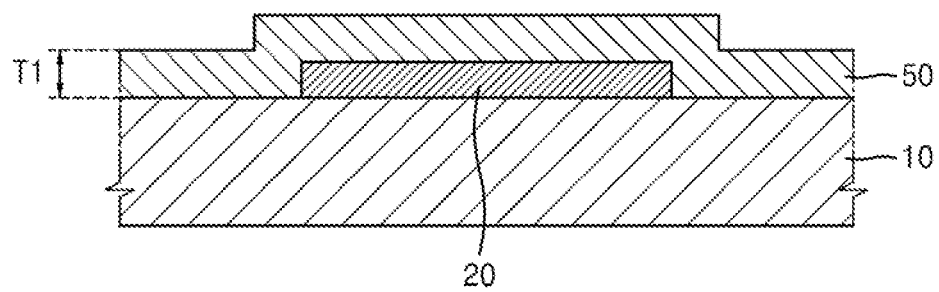

Referring to FIG. 5, the first barrier layer 50 may be disposed on the substrate 10 and may have the first thickness TI to cover the display unit 20. The first barrier layer 50 may be disposed by depositing an inorganic material on the display unit 20 through a CVD process or an ALD process. The first thickness TI of the first barrier layer 50 may be about 1 μm.

Figure 6:
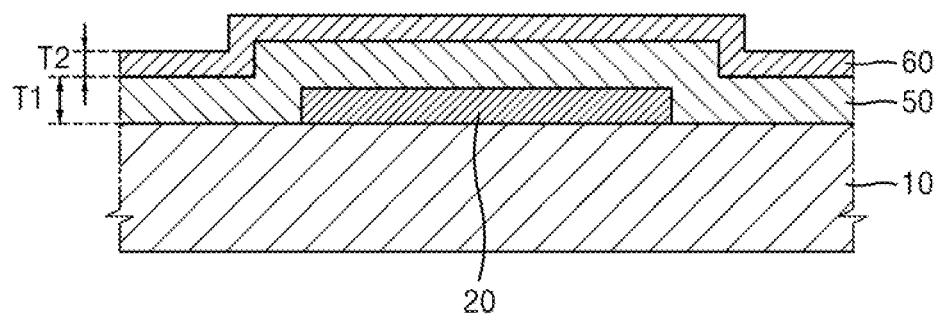

Referring to FIG. 6, the plasma polymer layer 60 may be disposed on the first barrier layer 50 to have the second thickness T2. The plasma polymer layer 60 may be disposed by depositing a monomer on the first barrier layer 50 through a CVD process, and more particularly, a PECVD process. The second thickness T2 of the plasma polymer layer 60 may be about 0.2 µm. The second thickness T2 of the plasma polymer layer 60 may be determined as a thickness sufficient to form an obtuse angle in close proximity to an acute angle between a non-flat area of the substrate 10 or the display unit 20 and the top flat surface of the substrate 10 or the display unit 20 described above.

The plasma polymer layer 60 may be disposed through a chemical reaction between a monomer including, for example, n-hexane, HMDSO, furan, TMDSO, TMMOS $(CH_3)_3SiOCH_3$, BTMSM, TEOS, DVTMDSO[$(CH_3)_2$ViSi—O—SiVi$(CH_3)_2$], OMCATS, or combinations thereof, and $H_2$ gas or an oxygen-based gas like $N_2O$, $O_2$, and $O_3$. For example, a carbon-containing silicon oxide (SiOxCy) film may be disposed as the plasma polymer layer 60 on the first barrier layer 50 through a chemical reaction between HMDSO and $H_2$ gas or $O_2$ gas.

During a deposition process, the fluidity of the plasma polymer layer 60 may be controlled by adjusting process conditions including a temperature, a pressure, and a flow rate of a gas. For example, the plasma polymer layer 60 may be deposited on the first barrier layer 50 by adjusting the process conditions, such that the plasma polymer layer 60 has a first fluidity sufficient to reduce the roughness of a non-flat area in the substrate 10 or the display unit 20.

The plasma polymer layer 60 having the first fluidity may be cured through an additional plasma treatment. The plasma polymer layer 60 may be plasma post-treated to reduce carbon content thereof by using $H_2$ gas or an oxygen-based gas like $N_2O$, $O_2$, or $O_3$. Therefore, the plasma polymer layer 60 after plasma post-treatment has a second fluidity that is smaller than the first fluidity, and thus, plasma polymer layer 60 may maintain the shape formed during the deposition process. Carbon contents corresponding to the first fluidity and the second fluidity are not particularly limited and may be determined according to fluidity for necessary bending characteristics of a display device and/or a structure of a non-flat area. In addition, as described above, since the acute angle formed by the non-flat area of the substrate 10 or the display unit 20 may be changed to an obtuse angle by filling of a fluid plasma polymer on the first barrier layer 50, the first fluidity of the plasma polymer layer 60 may determine whether a chosen second thickness T2 of the plasma polymer layer 60 is sufficient to form an obtuse angle. For the plasma polymer layer 60 having high first fluidity, smaller second thickness T2 may be sufficient to form the obtuse angle.

Figure 7:
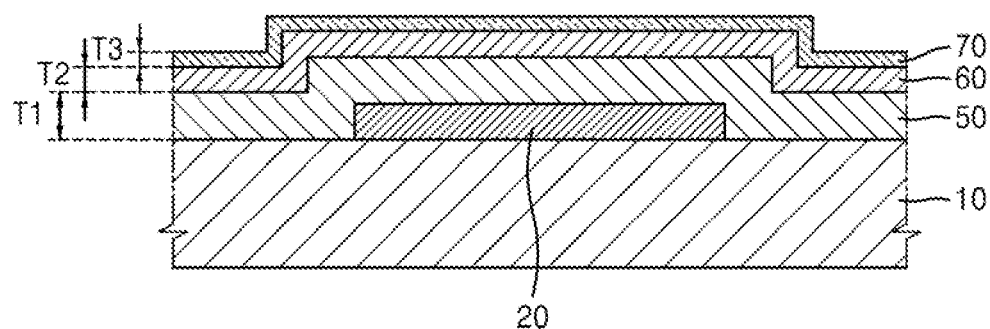

Referring to FIG. 7, the second barrier layer 70 may be disposed on the plasma polymer layer 60 to have a third thickness T3. The second barrier layer 70 may be disposed by depositing an inorganic material on the plasma polymer layer 60 through a CVD process or an ALD process. The third thickness T3 of the second barrier layer 70 may be in a range from about 0.03 µm to about 0.2 µm.

Figure 8:
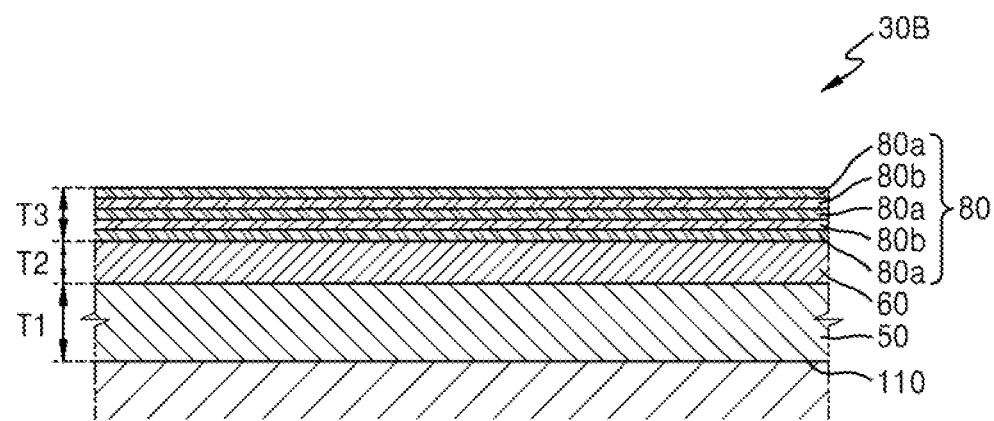
FIG. 8 is a cross-sectional view showing an exemplary embodiment of the encapsulating member shown in FIG. 1.

FIG. 8 is a cross-sectional view showing an exemplary embodiment of the encapsulating member shown in FIG. 1.

Referring to FIG. 8, an encapsulating member 308 according to an exemplary embodiment of the present inventive concept may include the first barrier layer 50, the plasma polymer layer 60, and a second barrier layer 80, which are sequentially arranged on an insulating surface 110. For example, the first barrier layer 50, the plasma polymer layer 60 and the second barrier layer 80 may sequentially and vertically stacked on the insulating surface 110. As shown in FIG. 1 the insulating surface 110 may be the top surface of the substrate 10, which is an insulating substrate, or the top surface of the display unit 20 above the substrate 10. The top surface of the display unit 20 may be the top surface of an insulating layer covering a light-emitting device, e.g., an OLED. The exemplary embodiment of FIG. 8 differs from the exemplary embodiment of FIG. 2 in terms of the second barrier layer 80. Hereinafter, descriptions identical to those given above with reference to FIGS. 1 to 6 will be omitted.

The first barrier layer 60 may be disposed on the display unit 20 through a CVD process in a vacuum chamber. The first barrier layer 50 may be an inorganic film having the first thickness T1. The first barrier layer 50 may be disposed to a thickness of about 1 µm.

The first barrier layer 50 may be a single layer or a multi-layer including any one of, for example, a silicon nitride ($SiN_x$) film, a silicon oxide ($SiO_2$) film, a silicon oxynitride (SiON) film, a metal film, or a metal oxide film, e.g., $Al_2O_3$, AlON, MgO, ZnO, $HfO_2$, $ZrO_2$, etc., or a combination of two or more thereof.

The plasma polymer layer 60 may be disposed on the first barrier layer 50 through a PECVD process. The plasma polymer layer 60 may be a thin film having the second thickness T2.

The second thickness T2 of the plasma polymer layer 60 may be determined as a thickness sufficient to form an obtuse angle in close proximity to an acute angle between a non-flat area of the substrate 10 or the display unit 20 and a top flat surface of the substrate 10 or the display unit 20. The acute angle formed by the non-flat area of an insulating surface 110 may be changed to an obtuse angle by filling of a fluid plasma polymer on the first barrier layer 50. The fluidity of the plasma polymer layer 60 may affect the determination of the second thickness T2 of the plasma polymer layer 60. For the plasma polymer layer 60 having high fluidity, smaller second thickness T2 may be sufficient. For example, the second thickness T2 of the plasma polymer layer 80 may be smaller than or equal to a half of the height of the non-flat area. That is, there is no need to have the plasma polymer layer 60 thick enough to cover the entire non-flat area with its flat top surface above the top of the non-flat area. The height of the non-flat area may be equivalent to a distance from the top flat surface of the substrate 10 or the display unit 20 to the apex of the non-flat area of the substrate 10 or the display unit 20. The second thickness T2 of the plasma polymer layer 60 may be smaller than or equal to the first thickness T1 of the first barrier layer 50. The plasma polymer layer 60 may be disposed to a thickness of about 0.2 µm.

The plasma polymer layer 60 may include a carbon-containing silicon oxide ($SiO_xC_y$). The plasma polymer layer 60 may be disposed through plasma polymerization of a monomer using $H_2$ gas or an oxygen-based gas, e.g., $N_2O$, $O_2$, $O_3$, etc. The fluidity of the plasma polymer layer 60 may be controlled by adjusting the carbon content of the plasma polymer layer 60 by adjusting process conditions including a temperature, a pressure, and a flow rate of $H_2$ gas or an oxygen-based gas during the deposition process. The monomer for forming the plasma polymer layer 60 may include, for example, n-hexane, HMDSO, furan, TMDSO, TMMOS $(CH_3)_3SiOCH_3$, BTMSM, TEOS, DVTMDSO[$(CH_3)_2$ViSi—O—SiVi$(CH_3)_2$], OMCATS, or combinations thereof.

The plasma polymer layer 60 may be cured through an additional plasma treatment. The plasma polymer layer 60 may be plasma post-treated to reduce carbon content thereof by using $H_2$ gas or an oxygen-based gas like $N_2O$, $O_2$, or $O_3$. As a result, the fluidity of the plasma polymer layer 60 after plasma post-treatment may be reduced, thereby maintaining the shape of the plasma polymer layer 60 formed during the deposition process.

The second barrier layer 80 may be disposed on the plasma polymer layer 60 to have a third thickness T3. The second barrier layer 80 may include a multi-layer such as, for example, a nano hybrid layer (NHL), in which at least one inorganic film 80a and at least one organic film 80b are alternately deposited.

The inorganic film 80a may be disposed through a CVD process or an ALD process.

The inorganic film 80a may include any one of, for example, a silicon nitride ($SiN_x$) film, a silicon oxide ($SiO_2$) film, a silicon oxynitride (SiON) film, a metal film, or a metal oxide film, e.g., $Al_2O_3$, AlON, MgO, ZnO, $HfO_2$, $ZrO_2$, etc., or a combination of two or more thereof. The inorganic film 80a may be disposed to a thickness in a range from about 0.1 μm to about 0.5 μm.

The total thickness of the at least one inorganic film 80a constituting the second barrier layer 80 may be smaller than or equal to the second thickness T2 of the plasma polymer layer 60. The third thickness T3 of the second barrier layer 80 may be greater than the second thickness T2 of the plasma polymer layer 60, but the total thickness of the inorganic films 80a constituting the second barrier layer 80 may be smaller than or equal to the second thickness T2 of the plasma polymer layer 60.

The organic film 80b may be disposed through a CVD process or an ALD process. The organic film 80b may be disposed to a thickness in a range from about 0.1 μm to about 0.5 μm.

The organic film 80b may include, for example, a common general-purpose polymer (e.g., PMMA or PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, and blends thereof.

Figure 9:
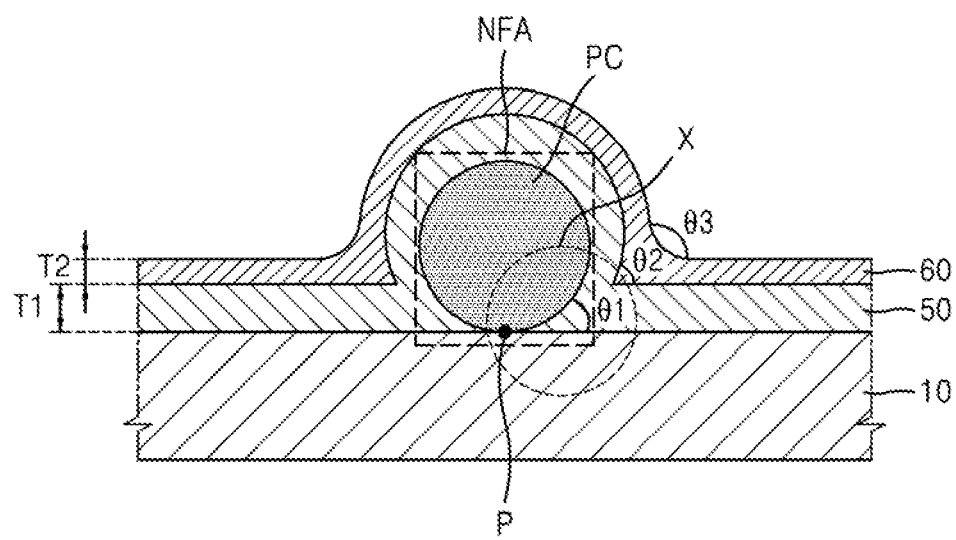
FIG. 9 is a diagram showing an example of disposing an encapsulating member according to an exemplary embodiment of the present inventive concept.

FIG. 9 is a diagram showing an example of disposing an encapsulating member according to an exemplary embodiment of the present invention.

During the process of disposing the display unit 20, a non-flat area (amorphous portion) NFA may appear on the substrate 10 or the display unit 20 due to a stamp of a mask or particles generated during deposition of an electrode. At this time, the top flat surface of the substrate 10 or the display unit 20 may form a predetermined first angle θ1 with the non-flat area NFA. For example, the first angle θ1 may be an angle between the non-flat area NFA of the substrate 10 or the display unit 20 and the flat top surface of the substrate 10 or the display unit 20 in the non-flat area NFA.

Referring to FIG. 9, a particle PC generated during deposition of a silver electrode of the display unit 20 remains on the substrate 10 and constitute the non-flat area NFA. The first angle θ1 may be an angle between inclined surfaces of the particle PC and the top flat surface of the substrate 10 in a region X where the particle PC contacts the top flat surface of the substrate 10. For example, the first angle θ1 may be an angle between a tangent line passing on the surfaces of the particle PC and the top flat surface of the substrate 10 in the region X. The first angle θ1 may continuously increase from a contact point P because the surfaces of the particle PC have round shapes.

The first barrier layer 50 is deposited on the substrate 10 to the first thickness T1 along the shape of the particle PC. At this time, in a region corresponding to the region X, a surface of the first barrier layer 50 parallel to the substrate 10 and an inclined surface of the first barrier layer 50 may form a second angle θ2. The second angle θ2 may be smaller than or equal to the first angle θ1. The first angle θ1 and the second angle θ2 may be acute angles greater than 0 degree and smaller than 90 degrees.

The plasma polymer layer 60 having fluidity is then deposited on the first barrier layer 50 to have the second thickness T2 along the shape of the particle PC. At this time, in a region corresponding to the region X, a surface of the plasma polymer layer 60 parallel to the substrate 10 and an inclined surface of the plasma polymer layer 60 may form a third angle θ3. The third angle θ3 may be an obtuse angle greater than the first angle θ1 or the second angle θ2 and smaller than 180 degrees. Thus, the plasma polymer layer 60 may have the third angle θ3 greater than the first angle θ1 between the non-flat area NFA of the substrate 10 or the display unit 20 and the flat top surface of the substrate 10 or the display unit 20 in the non-flat area NFA. The third angle θ3 may be greater than 90 degrees and smaller than 180 degrees. The second thickness T2 of the plasma polymer layer 60 may be smaller than or equal to a half of the height (e.g., maximum diameter) of the particle PC.

Figure 10:
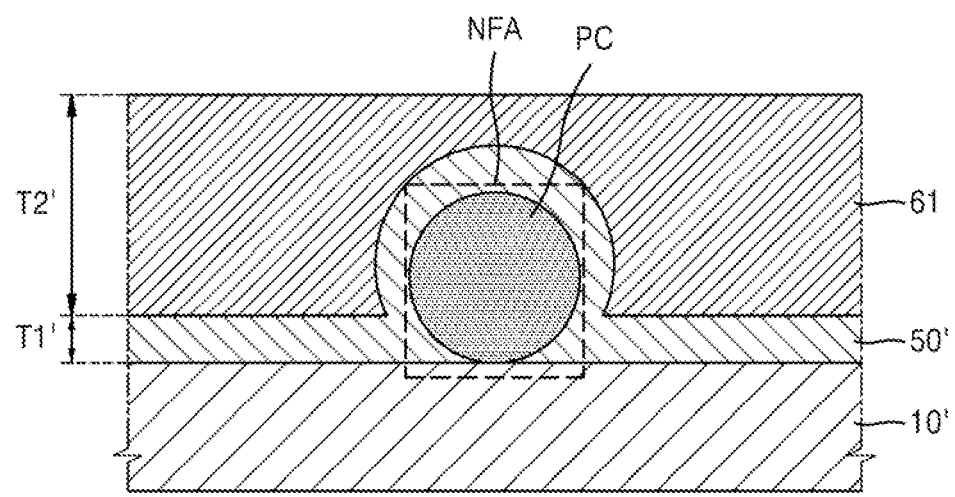
FIG. 10 is a diagram showing an example of disposing an encapsulating member according to a comparative example.

FIG. 10 is a diagram showing an example of disposing an encapsulating member according to a comparative example.

Referring to FIG. 10, a particle PC generated during deposition of a silver electrode of the display unit 20 on a substrate 10' exists as the non-flat area NFA.

A first barrier layer 50' may be deposited on the substrate 10' to a first thickness T1' along the shape of the particle PC. Next, an organic layer 61, which completely covers the particle PC and has a flat top surface, may be deposited on the first barrier layer 50'.

In the comparative example of FIG. 10, the organic layer 61 is deposited to a second thickness T2' for removing non-flatness due to the particle PC. In this case, since the thickness of the organic layer 61 above an inorganic film becomes equal to or greater than the height (e.g., diameter) of the particle PC, the thickness of the entire encapsulating member increases. As a result, strain may increase at the encapsulating member, and thus a defect may occur in a display device. Furthermore, as the entire thickness of a display device increases, it is difficult to apply an encapsulating member to the display device, which is a flexible display device.

In contrast to the comparative example of FIG. 10, according to the exemplary embodiment of the present inventive concept shown in FIG. 9, an acute angle formed by a non-flat area NFA of an insulating surface due to particles is changed to an obtuse angle by filling of a fluid plasma polymer. As a result, the thickness of a plasma polymer above the inorganic film may be reduced and penetration of moisture or air into the non-flat area NFA may be reduced, thereby facilitating deposition of a second barrier layer to be deposited thereafter. Therefore, since the thickness of an encapsulating member may be reduced, the overall thickness of the display device may be reduced, thus being suitable to be applied to a flexible (foldable, rollable, stretchable) display device.

The plasma polymer layer 60 having the function of an organic film and fluidity according to an exemplary embodiment of the present inventive concept is disposed to a thickness sufficient for forming an obtuse angle at a deformed portion of an underlying inorganic film, which is formed to have an acute angle due to a non-flat area NFA, instead of flattening the non-flat area NFA by completely covering the non-flat area NFA. Therefore, the thickness of the plasma polymer layer 60 may be minimized while preventing penetration of moisture or oxygen into the non-flat area NFA.

According to an exemplary embodiment of the present inventive concept, by depositing a plasma polymer as a portion of an encapsulating member, the time for forming the plasma polymer and the plasma polymer properties may be significantly enhanced as compared to chemical polymers. The chemical polymers may be polymers formed at room temperature through spin-coating process. Furthermore, since a plasma polymer may be disposed to a relatively small thickness as compared with a chemical polymer, the flexibility of a display device may be secured while maintaining characteristics for covering underlying devices.

Exemplary embodiments of the present inventive concept may provide an encapsulation structure capable of securing barrier characteristics with a reduced thickness and a display device including the encapsulation structure.

It should be understood that exemplary embodiments of the present inventive concept described herein should be considered in a descriptive sense only and not for purposes of limitation. Descriptions of features or aspects within each exemplary embodiment should typically be considered as available for other similar features or aspects in other embodiments. While specific exemplary embodiments have been described with reference to the figures, it will be understood by those of ordinary skill in the art that various changes in form and details may be made therein without departing from the spirit and scope as defined by the following claims.

What is claimed is:

1. An encapsulating structure comprising:
a first barrier layer comprising a first inorganic layer having a first thickness on a substrate;
a plasma polymer layer on the first inorganic layer, the plasma polymer layer having a second thickness smaller than or equal to the first thickness; and
a second barrier layer comprising at least one second inorganic layer on the plasma polymer layer,
wherein the at least one second inorganic layer has a third thickness and the third thickness is smaller than or equal to the second thickness, and
the plasma polymer layer has a second angle greater than a first angle between a non-flat area of the substrate and a flat top surface of the substrate in the non-flat area.

2. The encapsulating structure of claim 1, wherein the plasma polymer layer comprises a carbon-containing silicon oxide.

3. The encapsulating structure of claim 1, wherein the second barrier layer is a multi-layer in which the at least one second inorganic layer and at least one organic layer are alternately deposited.

4. An organic light-emitting display device comprising:
a display unit disposed on a substrate; and
an encapsulating member disposed on the substrate and the display unit and comprising:
a first inorganic layer covering the display unit and the substrate and having a first thickness;
a plasma polymer layer covering the first inorganic layer and having a second thickness smaller than or equal to the first thickness; and
a barrier layer comprising at least one second inorganic layer covering the plasma polymer layer,
wherein the at least one second inorganic layer has a third thickness and the third thickness is smaller than or equal to the second thickness, and
a height of a flat top surface of the plasma polymer layer not over a non-flat area on the substrate or the display unit is smaller than a height of the non-flat area.

5. The organic light-emitting display device of claim 4, wherein
the plasma polymer layer comprises a carbon-containing silicon oxide.

6. The organic light-emitting display device of claim 4, wherein
the barrier layer is a multi-layer in which the at least one second inorganic layer and at least one organic layer are alternately deposited.

7. The organic light-emitting display device of claim 4, wherein
the plasma polymer layer comprises material formed from a monomer selected from one of hexamethyldisiloxane, furan, hexane, and combinations thereof.

8. The organic light-emitting display device of claim 4, wherein
the plasma polymer layer has a second angle greater than a first angle between the non-flat area of the substrate or the display unit and a flat top surface of the substrate or the display unit in the non-flat area.

9. The organic light-emitting display device of claim 8, wherein
the second angle is an angle smaller than 180 degrees.

10. The organic light-emitting display device of claim 8, wherein
the second thickness is smaller than or equal to half of a height of the non-flat area.

11. An organic light-emitting display device comprising:
a display unit disposed on a substrate; and
an encapsulating member disposed on the substrate and the display unit and comprising:
a first inorganic layer covering the display unit and the substrate and having a first thickness;
a plasma polymer layer covering the first inorganic layer and having a second thickness smaller than the first thickness; and
a barrier layer comprising at least one second inorganic layer covering the plasma polymer layer,
wherein the plasma polymer layer has a second angle greater than a first angle between a non-flat area of the substrate or the display unit and a flat top surface of the substrate or the display unit in the non-flat area.

12. The organic light-emitting display device of claim 11, wherein
the second thickness is smaller than or equal to half of a height of the non-flat area.

13. The organic light-emitting display device of claim 11, wherein
the second angle is greater than 90 degrees and smaller than 180 degrees.

14. The organic light-emitting display device of claim 11, wherein
the barrier layer is a multi-layer in which the at least one second inorganic layer and at least one organic layer are alternately deposited.

* * * * *